United States Patent [19]
Peck

[11] Patent Number: 5,361,055
[45] Date of Patent: Nov. 1, 1994

[54] PERSISTENT PROTECTIVE SWITCH FOR SUPERCONDUCTIVE MAGNETS

[75] Inventor: Scott D. Peck, San Diego, Calif.

[73] Assignee: General Dynamics Corporation, San Diego, Calif.

[21] Appl. No.: 169,092

[22] Filed: Dec. 17, 1993

[51] Int. Cl.$^5$ .................... H01F 1/00; H02H 7/00; H01H 47/00

[52] U.S. Cl. ..................... 335/216; 361/19; 361/141

[58] Field of Search ............... 361/19, 141; 323/360; 335/216; 307/306

[56] References Cited

U.S. PATENT DOCUMENTS

| | | | |
|---|---|---|---|
| 4,763,221 | 8/1988 | Takechi | 361/141 |
| 4,764,837 | 8/1988 | Jones | 361/19 |
| 4,930,034 | 5/1990 | Kusserow | 361/19 |
| 5,021,914 | 6/1991 | Tsurunaga | 361/19 |
| 5,093,645 | 3/1992 | Dorri | 335/216 |
| 5,153,804 | 10/1992 | Pham | 361/19 |
| 5,204,650 | 4/1993 | Nemoto | 335/216 |
| 5,210,674 | 5/1993 | Yamaguchi | 361/19 |
| 5,227,755 | 7/1993 | Westphal | 335/216 |

*Primary Examiner*—Leo P. Picard
*Assistant Examiner*—Stephen T. Ryan
*Attorney, Agent, or Firm*—John R. Duncan; Frank D. Gilliam

[57] ABSTRACT

A persistent switch system for protecting a large superconducting magnet coil during quench while providing the necessary different resistances needed for operation of the system in coil charging, discharging, persistent and quench modes while minimizing the heat load on the system refrigerator. The system includes a circuit having a combined persistent switch and shunt heater coil using two superconductor coils in parallel with a normal resistive thermal shunt coil thermally linked to the superconducting magnet coil. Switch superconducting coils can be driven normal to provide the switch resistance needed for efficient charging/discharging or the resistance needed to drive sufficient current through the shunt resistor coil during a quench. The quench operation uses shunt coil heating to enhance normal zone growth in the main coil, limiting the maximum quench temperatures reached. This system eliminates the heat leaks resulting from mechanical switches and allows the use of removable charge/discharge leads and their associated high heat leaks to significantly reduce the heat load on the refrigeration system, which typically operates at liquid helium temperatures.

16 Claims, 3 Drawing Sheets

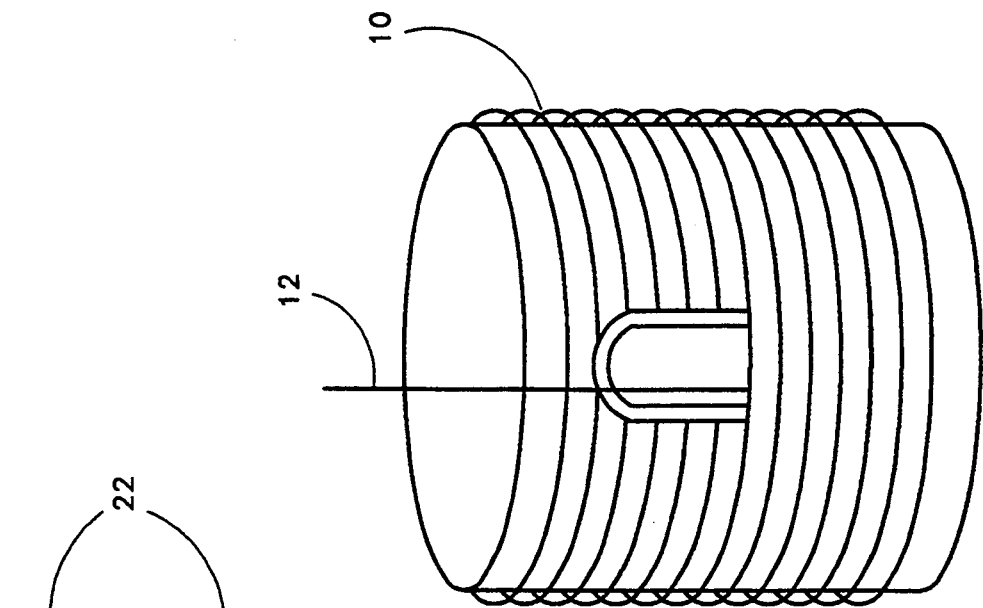
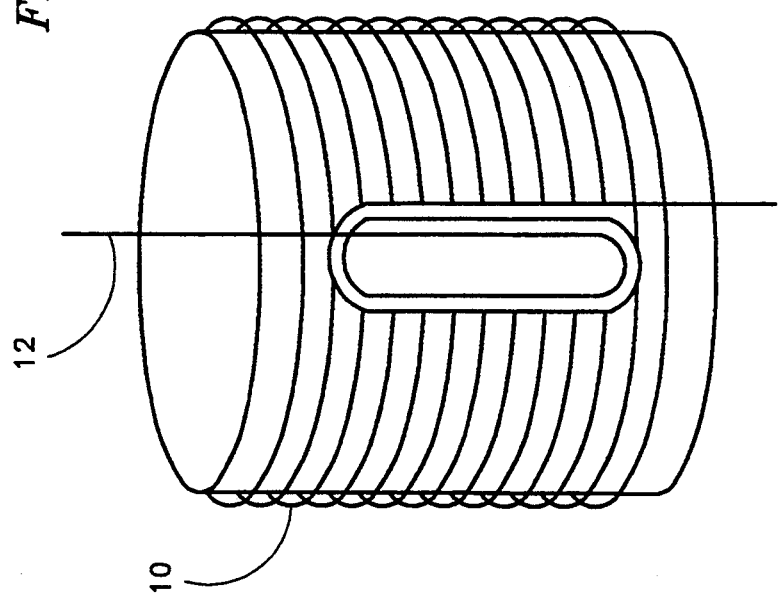

PERSISTENT PROTECTIVE SWITCH FOR SUPERCONDUCTIVE MAGNETS

BACKGROUND OF THE INVENTION

This invention relates in general to superconducting magnet systems and, more specifically, to a combined persistent switch and quench heater for use with large superconducting magnets.

Over the last few years, steady progress has been made in developing superconducting magnet technology for a wide range of applications, such as superconductive magnetic energy storage and load-balancing, magnetohydrodynamic marine propulsion systems, magnetic levitation rail propulsion, large high energy physics particle detector magnets, magnetic fusion coils and the like. These applications require the use of very high currents, with correspondingly large leads penetrating through the magnet refrigeration system for carrying the currents into and out of the superconducting magnet coil. Typically, with helium refrigeration, a well designed lead pair will have a helium liquifaction load of approximately 3 liters per hour per kiloamp. For high current applications in the 50–300 kA range, the refrigeration power requirements associated with the lead heat loads can become enormous, particularly in terms of power needed for the room temperature helium compressor. In mobile magnet systems, such as magnetic levitation rail systems and magnetohydrodynamic submarine propulsion systems, reductions in refrigeration requirements would result in reduced weight and/or increased range and performance. Thus, the ability to remove the leads during phases other than the charging and discharging periods would be highly desirable.

Any integrated removable lead scheme must provide the capability of shorting the main coil when the leads are removed. Mechanical switches connecting the coil terminals could be used, but their use would result in a large heat leak to the low-temperature refrigeration system, defeating the purpose of having the removable leads.

Persistent switches are commonly used to short the leads of small superconducting magnets, as described, for example, by M. N. Wilson, "Superconducting Magnets", Clarendon Pres, Oxford, England, 1983. A persistent switch is a non-inductive coil of superconducting wire whose temperature and resistive state can be controlled by means of a heater. When the heater is off, the wire comprising the switch is stable and in the superconducting state. This corresponds to the switch being closed and shorting the coil. Heat input to the switch coil winding drives the superconductor in the switch normal and opens the switch. Opening the switch provides the resistance which creates the potential across the coil necessary for charging and discharging.

Small, high current density, superconducting magnets operate at steady-state and are self protecting, i.e., normal zones propagate fast enough that the stored magnetic energy is dissipated over a sufficient volume of winding so that the conductor does not overheat. Larger high-field superconducting magnets have in the past required either an external dump resistor with permanent, high heat leak power leads or a system of heaters with uninterruptible power supplies and robust power leads to drive the winding normal and prevent damaging temperature excursions in winding hot spots.

Thus, there is a continuing need for a switching system for permitting the charge/discharge leads of a large superconducting magnet coil to be removed and the coil terminals to be shorted to provide an uninterrupted current path for persistent mode operations. This shorted path must be able to carry the full coil current, be of low resistance, and have the capability to act as a switch so that the magnet can be charged and discharged when the leads are connected. The switching system must also be absolutely reliable with very low charging and discharging losses.

SUMMARY OF THE INVENTION

The above-noted needs, and others, are met by a persistent switch system for use with high-field superconducting magnets having two charge/discharge current terminals, which basically comprises a first superconducting switch coil connected to the first terminal, a second superconducting switch coil connected in series between the first switch coil and the second terminal and a shunt coil of resistive wire connected in parallel with the second switch coil.

The shunt coil preferably acts as a resistive heater in good thermal and physical, contact with the high-field superconducting magnet to be protected. The shunt coil is electrically insulated from the main coil.

Quench heaters are imbedded in each of the first and second switch coils to drive them normal when needed, as detailed below.

The system selectively operates in a persistent mode during periods when energy is stored in the large superconducting magnet coil. The switch assembly has the primary purpose of maintaining flow of main coil current without degradation. In this mode, a superconductive electrical path is provided through the switch assembly, providing an extremely low resistance path. The system is capable of a very rapid response from the charging/discharging mode into the persistent mode.

The primary purpose of the switch assembly during the charging/discharging mode is to provide a safe, reliable, high resistance/low loss mechanism for imposing a voltage across the main coil. In the charging/discharging mode, the switch has high electrical resistance with low energy dissipation and heating. Low temperature is maintained in the resistive elements. Electrical short circuits and arcing are prevented. The system can rapidly transition into the charging/discharging mode.

In the quench mode, the primary purpose is to provide a mechanism for coil protection during a main coil quench that maintains safe operation and limits voltages to acceptable levels. The resistance is lower than during charging/discharging to limit coil voltages. Current is shunted into the quench heater coil. The coil elements are at low temperatures during quench. Electrical shorts and arcing are prevented and the system can transition into the quench mode rapidly.

BRIEF DESCRIPTION OF THE DRAWING

Details of the invention, and of certain preferred embodiments thereof, will be further understood upon reference to the drawing, wherein:

FIG. 6 is a schematic exploded view of two oppositely wound racetrack configuration shunt coils;

FIG. 7 is a schematic perspective view showing a shunt coil in contact with a main superconducting coil; and FIG. 8 is a schematic perspective view showing a shunt coil imbedded in a main superconducting coil.

DETAILED DESCRIPTION OF PREFERRED EMBODIMENTS

Figure 1:
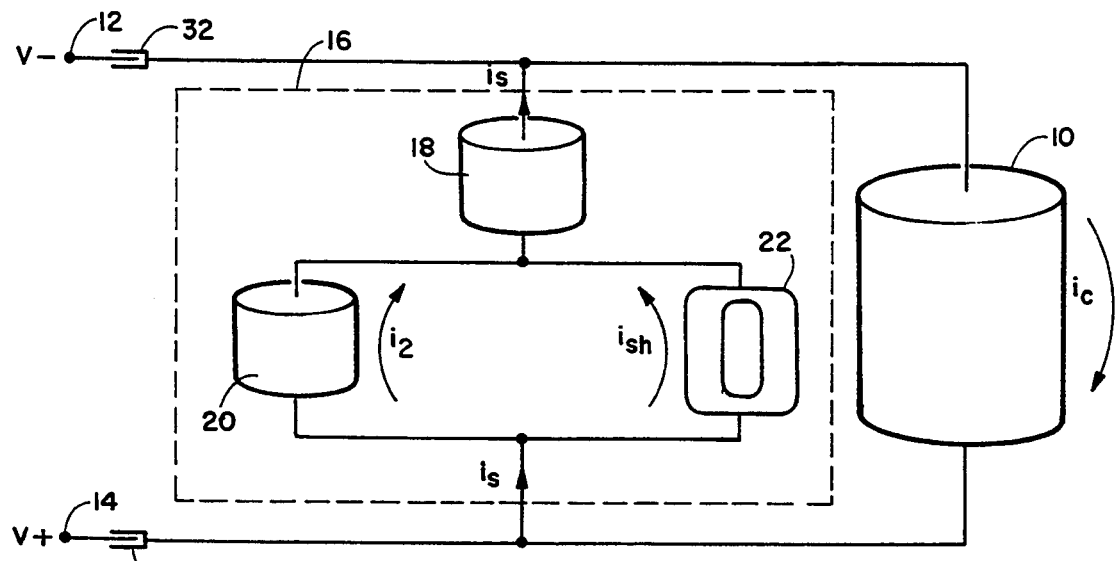
FIG. 1 is a schematic illustration of the physical coil system including the main coil and the switch and heater arrangement.

Referring to FIG. 1, there is seen a main coil 10 which may be any operating coil, such as an energy storage coil of the sort used in a superconducting magnet energy storage system, a magnetic levitation system or the like. Electrical terminals 12 and 14 are provided for charging and discharging coil 10 from an external source. While in the past, terminals 12 and 14 were at the ends of heavy cables that penetrated to the exterior of the system helium refrigeration system, resulting in a high heat leak path into the system, in accordance with this invention these terminals may be inside the refrigeration system, with high current leads inserted into them only during a charge or discharge cycle, when a power supply or load is connected across terminals 12 and 14.

A persistent switch/heater assembly is schematically indicated within broken line box 16. This assembly includes a first switch coil 18 and a second switch coil 20, electrically connected in series between terminals 12 and 14. Both coils 18 and 20 are wound with superconducting wire and are within the refrigeration system maintaining them below their critical temperatures. Each of coils 18 and 20 includes an imbedded quench heater, as described in detail in conjunction with the description of FIG. 5, below. The heaters are independently controlled by electrical wires (not shown) extending to the exterior of the system so that either or both of coils 12 and 14 can be quenched by heating the superconducting coils above their critical temperatures. The design of coils 18 and 20 may be identical.

A shunt coil 22 wound with resistive (i.e., non-superconducting) wire is connected in parallel with second switch coil 20 and is mounted to the surface of main coil 10 (or could be imbedded in main coil 10).

Main coil 10 and switch coils 18 and 20 are wound from any suitable superconducting wire. Typically, NbTi or Nb$_3$Sn wire may be used where the system is cooled with liquid helium to maintain the coils below the critical temperatures of these materials. The so-called high temperature superconductors, such as YBa$_2$Cu$_3$O$_7$, having critical temperatures above the temperature of liquid nitrogen may be used with liquid nitrogen as the refrigerant. As other superconductors with still higher critical temperatures are developed, they may be used with suitable refrigerants.

Shunt coil 22 is preferably wound as a non-inductive "pancake" coil, using any suitable resistive wire, such as those sold under the trademarks Chromel A, available from the Hoskins Manufacturing Co, Nichrome 60, available from the Driver-Harris Co., Inconel 600, available from the International Nickel Co. etc. In some cases, non-resistive metals such as copper, iron or nickel may be preferred, where the highly resistive alloy would cause excessive localized heating after quench. The preferred shunt coil arrangement uses two parallel coils wound in opposite directions in a racetrack configuration, one on top of the other, separated by thin layers of Kapton electrical insulation. "Racetrack configuration" refers to the configuration of a conventional racetrack as used for horse racing, automobile racing and track-and-field events, having two elongated straight sides connected by semicircular ends. The preferred arrangement of shunt coil 22, with two parallel insulated racetrack configuration coils, wound in opposite directions, is schematically illustrated in FIG. 6. Preferably, the coils are potted in a low-porosity epoxy/fiberglass compound, such as that available from the Emerson-Cummings Co. under the Stycast trademark. The coil is formed on a mandrel having the shape of the exterior of the main coil and may have thermal insulation on the outside to direct heat emitted toward the main coil windings. If desired, the shunt coil may be imbedded in the main coil windings. FIG. 7 schematically illustrates a shunt coil 12, configured as described above, in contact with the exterior of main coil 10. FIG. 8 schematically illustrates a shunt coil, configured as described above, imbedded in a main coil 10, with some windings of main coil 10 removed to shown the position of the imbedded shunt coil.

Figure 2:
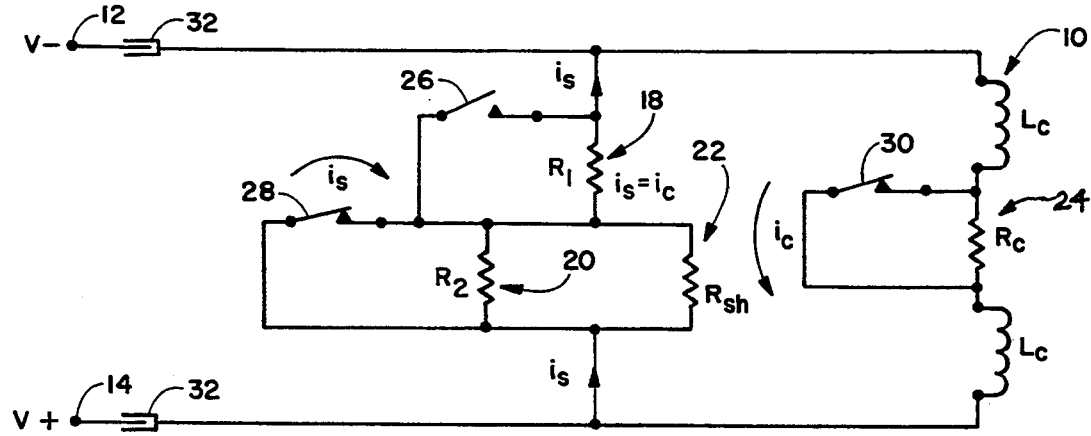
FIG. 2 is a schematic electrical diagram of the system in the charge/discharge mode.
Figure 3:
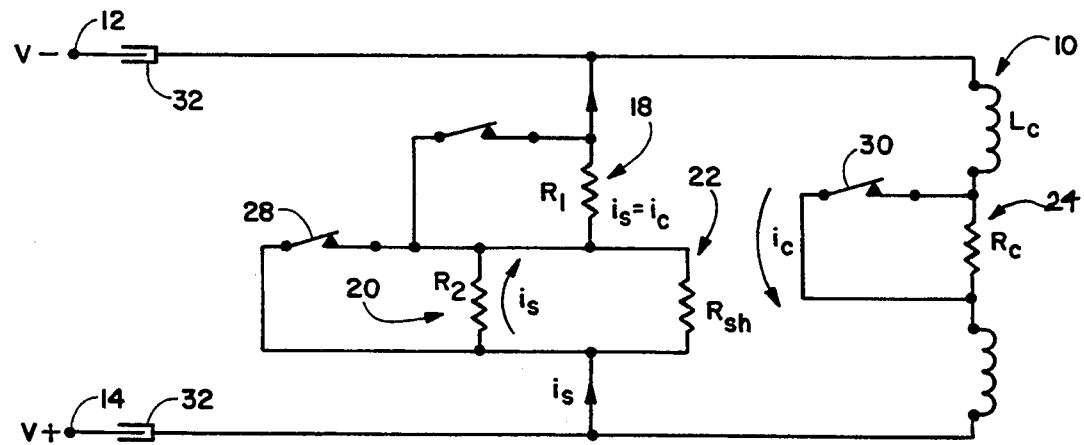
FIG. 3 is a schematic electrical diagram of the system in the persistent mode.
Figure 4:
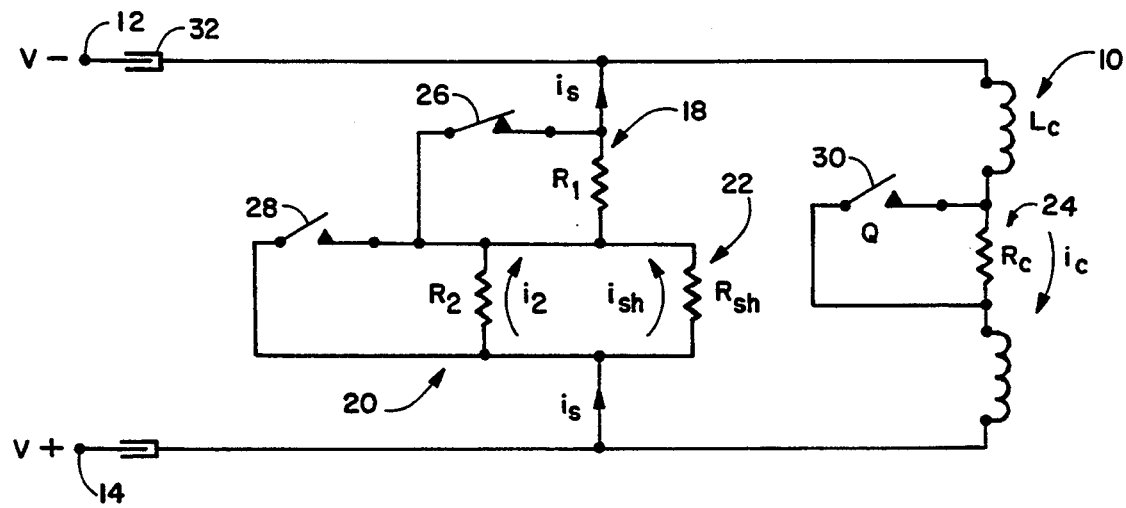
FIG. 4 is a schematic electrical diagram of the system in the quench mode.

Electrical schematic illustrations of the persistent switch assembly in the charge/discharge mode, the persistent mode, and the quench mode are provided in FIGS. 2, 3 and 4, respectively.

During charging of main coil 10 (schematically represented by inductance $L_c$ and the resistance $R_c$ which is present when the coil is in a normal state) from an external power supply or discharge of the main coil into an external load, a voltage "V" is imposed across terminals 12 and 14. First switch coil 18 (schematically including resistance $R_1$ and open switch 26 when the coil is normal and closed switch 26 when the coil is superconducting) is normalized by heating the superconductor making up the coil above its critical temperature with the imbedded heater, represented by resistor 24. Open switch 26 represents the normalized superconductor, which no longer allows current to flow without resistance. The heater imbedded in coil 18 is activated through a wire (not shown) to an external switch and power supply.

Second switch coil 20 remains in the superconducting path, to provide a resistance-free path around shunt coil 22, as symbolically indicated by closed switch 28. Switch 28 is open and resistance $R_2$ is present when coil 22 is in the normal state.

Current $i_s$ flows through the persistent switch assembly, while main coil current $i_c$ (either charge or discharge) flows through main coil 10. Thus, the necessary circuit resistance is provided to allow charging or discharging of main coil 10 without causing any external heating of the main coil that could cause an inadvertent quench.

The electrical configuration of the circuit during the persistent mode is shown in FIG. 3. Here, Main coil 10 is simply storing energy. As suggested by the breaks in the lines adjacent to terminals 12 and 14, in this mode external power connections may be removed to reduce heat leakage into the system and the resulting increase in refrigeration requirements. Switches 26, 28 and 30 simply symbolize the superconductive state when shown closed and the normal (non-superconducting) state when shown open.

In the persistent mode, the heaters imbedded in first and second switch coils 18 and 20, respectively, are turned off, leaving both switches in the "zero resistance" superconducting state, as indicated symbolically by closed switches 26 28 and 30. The main coil current $i_c$ equals the switch assembly current $i_s$ and flows without resistance.

When a problem occurs in the system, such as development of a hot spot in the main coil winding, a system quench may be called for. The energy in main coil 10 must be dumped rapidly without overheating any system component. FIG. 4 illustrates the persistent switch assembly in the quench mode.

The imbedded heater in second switch coil 20 is turned on through an external wire (not shown) to raise the temperature of second switch coil above the critical temperature, increasing switch resistance. First switch coil 18 remains in the superconducting, zero resistance, state as indicated by closed symbolic switch 26. Thus, the current $i_s$ flowing through the persistent switch assembly is divided, with $i_2$ passing through the resistance present in the now non-superconducting coil 20 and $i_{sh}$ passing though the shunt coil, heating a large area of the main coil 10 winding and driving it normal. The resistance in shunt coil 22 is selected so that most of the current will flow therethrough. This causes that portion of main coil 10 to have appreciable resistance, as indicated by open symbolic switch 30, so that energy in the main coil is dissipated as heat. This heat can be spread over a sufficient area that any excessive local temperature rise is avoided.

Figure 5:
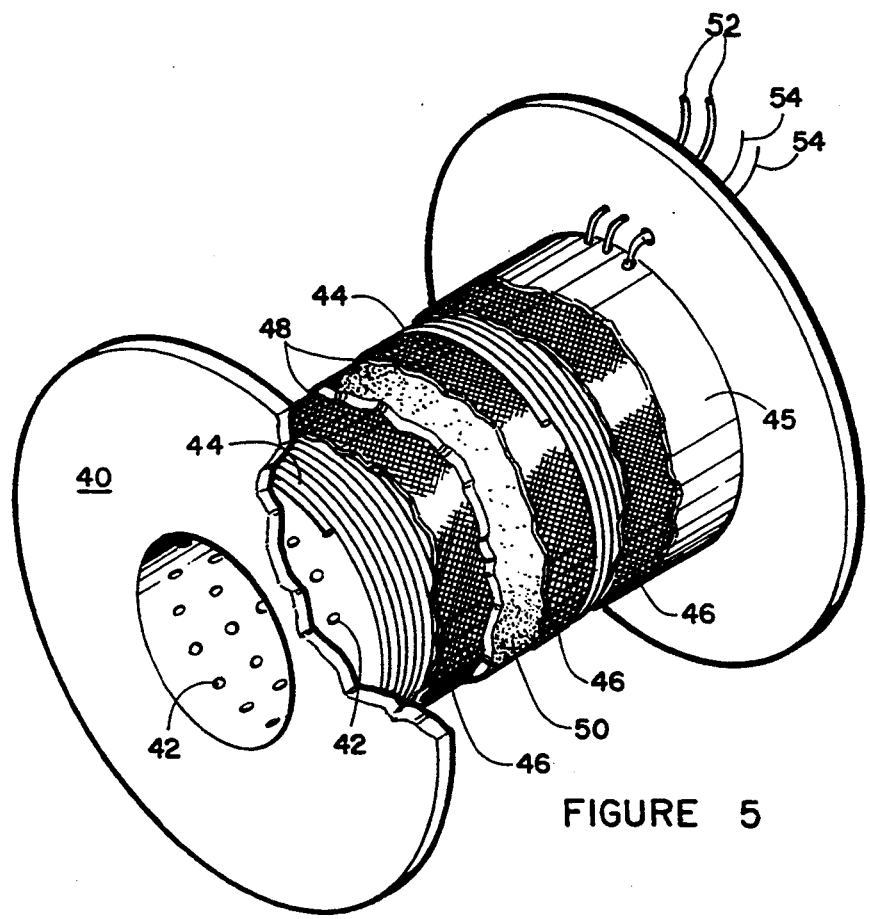
FIG. 5 is a schematic axial section through a switch coil.

FIG. 5 shows a schematic axial section through a preferred solenoid coil of the sort used for switch coils 18 and 20. The coil is wound on a bobbin 40 having a plurality of vent holes 42 for the refrigerant, typically helium, to aid in rapid cool-down and recovery to the superconducting state after a quench. A first winding of superconducting wires 44 is wound from a CuNi stabilized NbTi with a Formvar resin coating. A superconductor with a high normal state resistance is preferred for use in the switch coils. The coil is imbedded in an epoxy matrix resin 45 and wrapped with layers of fiberglass tape 46 to provide standoff and void space for the epoxy, followed by a Kapton tape 48 wrap to provide improved electrical insulation. Thermofoil heaters 50 from Minco Inc are wrapped around the assembly and imbedded in the epoxy resin, followed by additional Kapton insulation 48 and fiberglass layers 46. A second coil superconductor winding 44 is applied, winding in the opposite direction to make the final coil non-inductive. A final layer of epoxy resin 45 and fiberglass 46 is applied. The assembly of coil wires and heaters is uniformly imbedded in the substantially void-free resin 45.

Coil lead wires 52 exit the assembly and are connected as shown in FIGS. 1-4. Heater lead wires 54 exit the switch assembly to a location where conventional manual or automatic system controls are provided. Since the heater wires are quite thin, they do not carry a significant amount of heat into the refrigerated container. While the switch coil configuration and components is preferred for simplicity and effective operation, other coil designs may be used if desired.

Other applications, variations and ramifications of this invention will occur to those skilled in the art upon reading this disclosure. Those are intended to be included within the scope of this invention, as defined in the appended claims.

I claim:

1. A persistent switch system for use with a main high-field superconducting magnet coil which comprises:
   a first switch coil formed from superconducting material connected to a first of two charge/discharge terminals of a high-field superconducting magnet coil;
   a first quench heater in physical contact with said first switch coil;
   a second switch coil formed from superconducting material connected in series with said first switch coil and connected in series with the second of said two charge/discharge terminals;
   a second quench heater in physical contact with said second switch coil;
   a shunt coil wound with resistive wire, connected in parallel with said second switch coil and in physical contact with said main high-field superconducting magnet coil to heat a selected area of the main high-field superconducting magnet coil to a normal state; and
   means for refrigerating said first and second switch coils to temperatures at which said first and second switch coils are in a superconducting state.

2. The system according to claim 1 wherein said first and second quench heaters are imbedded in said first and second switch coils, respectively.

3. The system according to claim 1 wherein said switch coils are wound in at least two opposite-wound layers and said heater is imbedded between said layers so as to form a non-inductive coil.

4. The system according to claim 1 wherein said shunt coil is a pancake coil formed from at least two coils wound in opposite directions in racetrack configurations and said pancake coil has a shape corresponding to the exterior of said main coil and is in substantially uniform physical contact with said main coil.

5. The system according to claim 1 wherein said shunt coil is imbedded within said main coil.

6. The system according to claim 1 wherein said shunt coil is brought into intimate physical contact with the exterior of said main coil to heat main coil windings to a normal state.

7. A high-field superconducting magnet system having a persistent switch system for permitting removal of current leads when not operating in a charge Or discharge mode, which comprises:
   a main high-field magnet coil having first and second charge/discharge terminals:
   a persistent switch system connected across said terminals; said persistent switch system comprising:
     a first switch coil formed from superconducting material connected to a first said charge/discharge terminals;
     a first quench heater in physical contact with said first switch coil;
     a second switch coil formed from a superconducting material connected in series with said first switch coil and connected in series with the second of said terminals;
     a second quench heater in physical contact with said second switch coil;
     a shunt coil wound with resistive wire, connected in parallel with said second switch coil in contact with said main coil to heat an area of said main coil to the normal state; and
   means for refrigerating said main coil and said first and second switch coils to temperatures at which said first and second switch coils are in a superconducting state.

8. The system according to claim 7 wherein said first and second quench heaters are imbedded in said first and second switch coils, respectively.

9. The system according to claim 7 wherein said switch coils are wound in at least two opposite-wound layers and said heater is imbedded between said layers so as to form a non-inductive coil.

10. The system according to claim 7 wherein said shunt coil is a pancake coil formed from at least two coils wound in opposite directions in racetrack configurations and said coil is secured to the exterior of said main coil in substantially uniform physical contact therewith.

11. The system according to claim 7 wherein said shunt coil is physically mounted in contact with, and electrically insulated from, said, main high-field superconducting magnet coil to heat an area of said main coil by thermal conduction.

12. The system according to claim 7 wherein said shunt coil is imbedded within said main coil.

13. The method of protecting a main high-field superconducting magnet coil while permitting Current leads to be removed when not in a charge or discharge mode which comprises the steps of:

connecting a first switch coil formed from superconducting material to the first of two charge/discharge terminals of a high field superconducting magnet coil;

bringing a first heater into close physical contact with said first switch coil;

connecting a second switch coil formed from superconducting material in series between said first switch coil and the second of said two charge/discharge terminals;

bringing a second heater into close physical contact with said second switch coil;

connecting a shunt coil wound with resistive wire in parallel with said second switch coil;

mounting said shunt coil in physical contact with, but electrically insulated from, said main high-field superconducting magnet coil; and refrigerating said main coil and said first and second coils to temperatures at which said coils are in a superconducting state.

14. The method according to claim 13 wherein said first and second heaters are brought into close physical contact with said first and second switch coils, respectively, by imbedding them between coil layers in multilayer switch coils.

15. The method according to claim 13 wherein said shunt coil is wound as at least two opposite-wound, racetrack-configuration, stacked coils and including the step of securing said shunt coil to the exterior of said main coil in close physical contact therewith.

16. The method according to claim 13 wherein said shunt coil is brought into close physical contact with said main coil by imbedding said shunt coil in said main coil.

* * * * *